United States Patent
Vandame et al.

(10) Patent No.: US 10,719,948 B2
(45) Date of Patent: Jul. 21, 2020

(54) METHOD AND DEVICE FOR PROCESSING A LIGHTFIELD CONTENT

(71) Applicant: InterDigital CE Patent Holdings, SAS, Paris (FR)

(72) Inventors: Benoit Vandame, Betton (FR); Neus Sabater, Betton (FR); Olivier Bureller, Cesson Sevigne (FR)

(73) Assignee: InterDigital CE Patent Holdings, Paris (FR)

(*) Notice: Subject to any disclaimer, the term of this patent is extended or adjusted under 35 U.S.C. 154(b) by 0 days.

(21) Appl. No.: 15/569,737

(22) PCT Filed: Apr. 21, 2016

(86) PCT No.: PCT/EP2016/058919
§ 371 (c)(1),
(2) Date: Oct. 26, 2017

(87) PCT Pub. No.: WO2016/173925
PCT Pub. Date: Nov. 3, 2016

(65) Prior Publication Data
US 2018/0144492 A1    May 24, 2018

(30) Foreign Application Priority Data
Apr. 27, 2015   (EP) ..................... 15305645

(51) Int. Cl.
*G06K 9/32* (2006.01)
*G06T 7/557* (2017.01)
(Continued)

(52) U.S. Cl.
CPC .............. *G06T 7/557* (2017.01); *G03B 35/10* (2013.01); *H01L 27/14627* (2013.01);
(Continued)

(58) Field of Classification Search
CPC .......... G03B 35/10; G06T 2207/10052; G06T 7/557; H01L 27/14627; H04N 13/0011;
(Continued)

(56) References Cited

U.S. PATENT DOCUMENTS 8,400,555 B1 * 3/2013 Georgiev ........... H04N 5/23212
348/222.1
8,471,897 B2    6/2013 Rodriguez Ramos et al.
(Continued)

FOREIGN PATENT DOCUMENTS

EP    2475162    12/2011
JP    2013105151    5/2013

OTHER PUBLICATIONS

Sakurikar et al., "Dense View Interpolation on Mobile Devices using Focal Stacks", 2014 IEEE Conference on Computer Vision and Pattern Recognition Workshops, Columbus, Ohio, USA, Jun. 23, 2014, pp. 138-143.
(Continued)

*Primary Examiner* — Xin Jia
(74) *Attorney, Agent, or Firm* — Invention Mine LLC

(57) ABSTRACT

An apparatus to process a lightfield image of a scene acquired with a lightfield acquisition device comprises means for obtaining a first focal stack and a second focal stack, each comprising images representative of the scene and obtained from a different part of the pixels of the lightfield image. A method of processing the lightfield content is also described.

16 Claims, 10 Drawing Sheets

(51) Int. Cl.
  *G03B 35/10* (2006.01)
  *H01L 27/146* (2006.01)
  *H04N 5/232* (2006.01)
  *H04N 5/225* (2006.01)
  *H04N 13/111* (2018.01)
  *H04N 13/00* (2018.01)

(52) U.S. Cl.
  CPC ....... *H04N 5/2254* (2013.01); *H04N 5/23212* (2013.01); *H04N 13/111* (2018.05); *G06T 2207/10052* (2013.01); *H04N 2013/0081* (2013.01)

(58) Field of Classification Search
  CPC ......... H04N 13/111; H04N 2013/0081; H04N 5/2254; H04N 5/23212
  See application file for complete search history.

(56) References Cited

U.S. PATENT DOCUMENTS

| | | | |
|---|---|---|---|
| 8,749,620 B1* | 6/2014 | Knight | H04N 13/218 348/49 |
| 8,811,769 B1 | 8/2014 | Pitts et al. | |
| 2010/0103175 A1 | 4/2010 | Okutomi et al. | |
| 2013/0070060 A1 | 3/2013 | Chatterjee et al. | |
| 2014/0225991 A1 | 8/2014 | Lin et al. | |
| 2014/0333739 A1* | 11/2014 | Yang | G06K 9/4642 348/54 |

OTHER PUBLICATIONS

Thomas et al., "Depth map extraction from light field microscopes", 2013 12th Workshop on Information Optics, Puerto de la Cruz, Spain, Jul. 15, 2013, pp. 1-3.
Perez Nava et al., "Simultaneous Estimation of Super-Resolved Depth and All-in-Focus Images From a Plenoptic Camera", Potsdam, Germany, May 4, 2009, pp. 1-4.

* cited by examiner

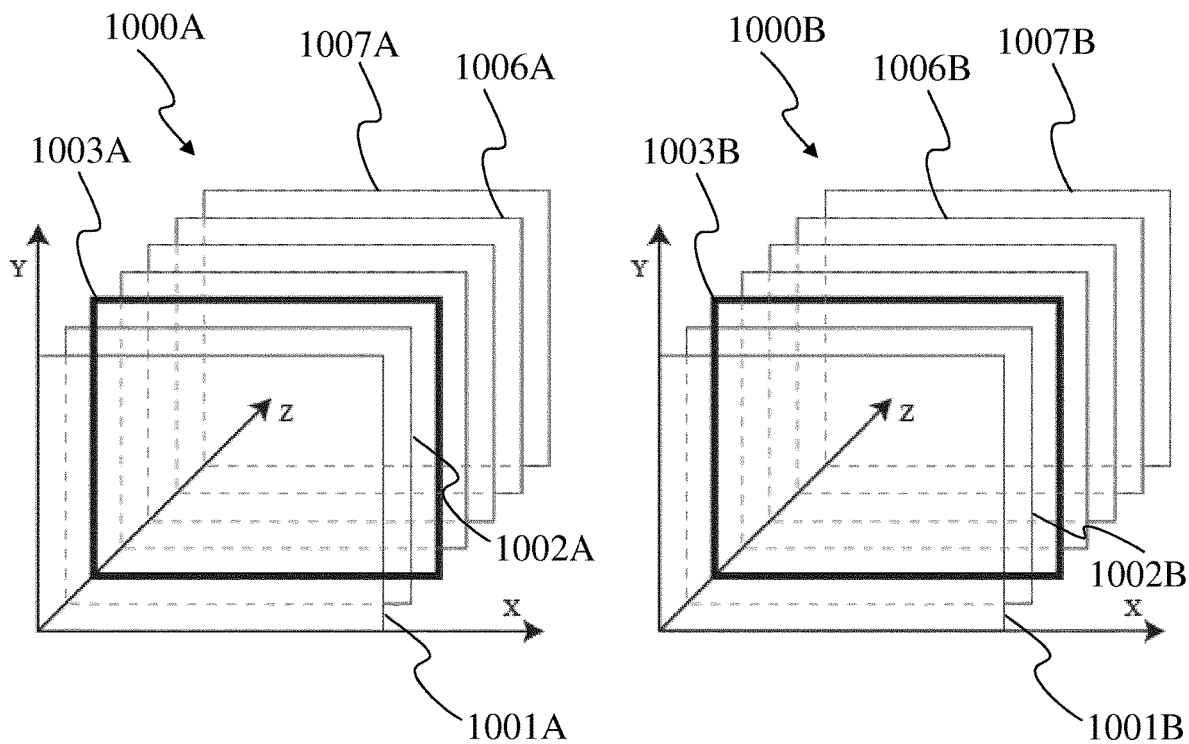
Fig 10
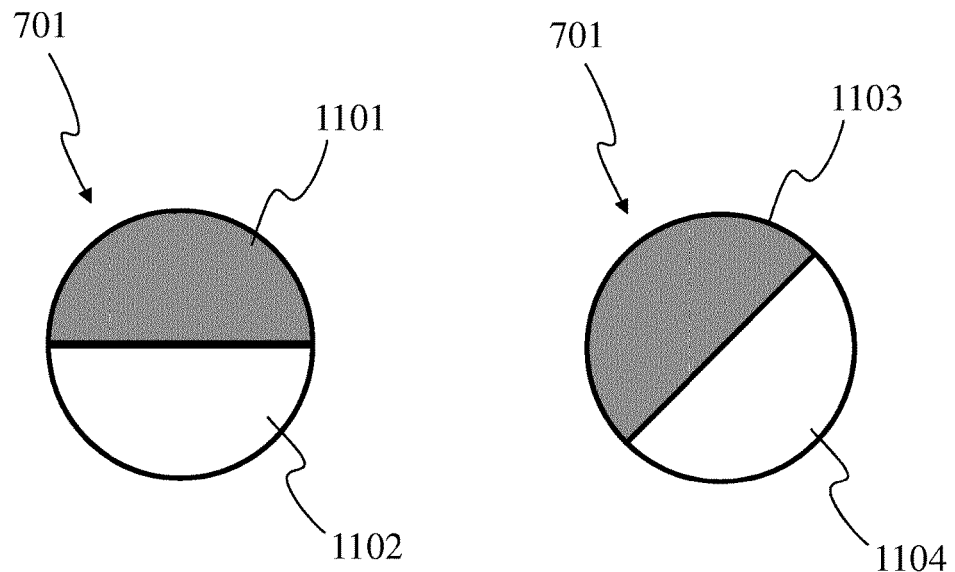
Fig 11A
Fig 11B

METHOD AND DEVICE FOR PROCESSING A LIGHTFIELD CONTENT

This application claims the benefit, under 35 U.S.C. § 365 of International Application PCT/EP2016/058919, filed Apr. 21, 2016, which was published in accordance with PCT Article 21(2) on Nov. 3, 2016, in English, and which claims the benefit of European Patent Application No. 15305645.2 filed Apr. 27, 2015.

1. TECHNICAL DOMAIN

The present disclosure relates to the domain of plenoptic camera and light-field acquisition devices and methods. The present disclosure also relates to the processing of the lightfield content obtained with a lightfield acquisition device and to the determination of disparity information.

2. BACKGROUND ART

According to the background art, it is known to acquire different views of a same scene in a single snapshot with a plenoptic camera, also called light-field camera. A direct application of such a plenoptic camera is 3D reconstruction. Indeed, after demultiplexing of the raw image acquired with the photosensor array of the plenoptic camera, the recovered views of the scene are already in epipolar geometry horizontally and vertically, so the disparity between them can be estimated without stereo rectification. This is a huge advantage compared to binocular 3D stereo reconstruction from images captured with a conventional camera.

Nevertheless, estimating disparity from views resulting from the demultiplexing of the raw image suffers from several issues. For example, the views resulting from the demultiplexing offers only one single color information for some of the pixels of the views while other pixels do not have any color information associated with them: the spatial color sampling of such views is often jagged and incomplete, which leads to erroneous disparity estimation. Also the demultiplexing of the raw image often rely on interpolation (de-multiplexed pixel with non-integer coordinate), which leads to erroneous disparity. A solution to such disparity estimation issues is to first demosaice the raw image before demultiplexing it in order to have full color information for each pixel of each view of the scene resulting from the demultiplexing. But performing the demosaicing before the demultiplexing may lead to other issues, such as inter-view crosstalk. Indeed, as to recover the full color information for one given pixel of the raw image, pixels belonging to the neighborhood of this given pixel may be used, even if these neighboring pixels belongs to other view(s) than the view of the given pixel. Estimating the disparity on such views suffering from inter-view crosstalk may also lead to disparity errors.

Moreover, determining the focus associated with object(s) of the acquired scene may be a heavy process subject to precision issues.

3. SUMMARY

The purpose of the present disclosure is to overcome at least one of these disadvantages of the background art.

The present disclosure relates to an apparatus configured to process a lightfield image of a scene acquired with an acquisition device configured to obtain a plurality of views of the scene. The apparatus comprises:

means for receiving a first focal stack comprising a plurality of first images each representative of the scene, a different depth value of a plurality of depth values being associated with each first image, the first images being obtained from a first set of pixels of the lightfield image;

means for receiving a second focal stack comprising a plurality of second images each representative of the scene, a different depth value of said plurality of depth values being associated with each second image, the second images being obtained from a second set of pixels of the lightfield image, the second set being different from the first set.

The present disclosure also relates to an apparatus configured to process a lightfield image of a scene acquired with an acquisition device configured to obtain a plurality of views of the scene. The apparatus comprises:

a receiver or a processing unit (e.g. a processor) configured to obtain a first focal stack comprising a plurality of first images each representative of the scene, a different depth value of a plurality of depth values being associated with each first image, the first images being obtained from a first set of pixels of the lightfield image; the receiver being further configured to receive a second focal stack comprising a plurality of second images each representative of the scene, a different depth value of said plurality of depth values being associated with each second image, the second images being obtained from a second set of pixels of the lightfield image, the second set being different from the first set.

The present disclosure also relates to a method of processing a lightfield image of a scene acquired with an acquisition device configured to obtain a plurality of views of the scene, the method comprising:

receiving a first focal stack comprising a plurality of first images each representative of the scene, a different depth value of a plurality of depth values being associated with each first image, said first images being obtained from a first set of pixels of said lightfield image;

receiving a second focal stack comprising a plurality of second images each representative of the scene, a different depth value of said plurality of depth values being associated with each second image, said second images being obtained from a second set of pixels of said lightfield image, the second set being different from the first set.

According to a characteristic, the apparatus further comprises:

means for comparing, for example a comparator, the first images with the second images in a way as to compare each first image with each second image having the same associated depth value as each first image;

means for obtaining, for example a processing unit, e.g. a processor, the information representative of depth from results of the comparing.

According to a characteristic, the method further comprises:

comparing the first images with the second images in a way as to compare each first image with each second image having the same associated depth value as said each first image;

obtaining an information representative of depth from results of the comparing.

According to a particular characteristic, the first focal stack is obtained from each first half of pixels of a plurality of microlens micro-images associated with microlenses of a microlens array of the acquisition device, the second focal stack is obtained from each second half of the pixels of the plurality of microlens micro-images, the first half and the second half of pixels of each microlens micro-image of the plurality being different and complementary.

Advantageously, the first focal stack is obtained from a first half of the views of the scene obtained from the acquisition device and the second focal stack is obtained from a second half of the views of the scene obtained from the acquisition device, the first half being different from the second half.

According to a specific characteristic, the first half and the second half are determined according to an information representative of orientation of at least one object of the scene within the scene.

Advantageously, the first half and the second half correspond to:
  a left half and a right half, respectively; or
  a upper half and a lower half, respectively.

According to another characteristic, the comparing comprises determining, in each pair of first and second images having the same associated depth value, disparity values associated with the pixels of the first image and/or pixels of the second image of each pair.

Advantageously, the comparing further comprises selecting, in each pair of first and second images having the same associated depth value, pixels of the first image and/or the second image of each pair having as disparity value a value close to 0.

The present disclosure also relates to a light-field acquisition device comprising the aforementioned apparatus.

The present disclosure also relates to a computer program product comprising instructions of program code for executing steps of the method of processing the lightfield image and/or of obtaining information representative of depth, when the program is executed on a computing device.

The present disclosure also relates to a processor readable medium having stored therein instructions for causing a processor to perform at least a step of the method of processing the lightfield image and/or of obtaining information representative of depth.

4. LIST OF FIGURES

The present disclosure will be better understood, and other specific features and advantages will emerge upon reading the following description, the description making reference to the annexed drawings wherein:

FIG. 10 shows first and second focal stacks obtained from a lightfield image obtained from the lightfield camera of FIG. 1 or 2, according to a particular embodiment of the present principles;

FIGS. 11A and 11B show different orientations of the partition of a microlens micro-image of FIG. 4, according to particular embodiments of the present principles;

Figure 14A:
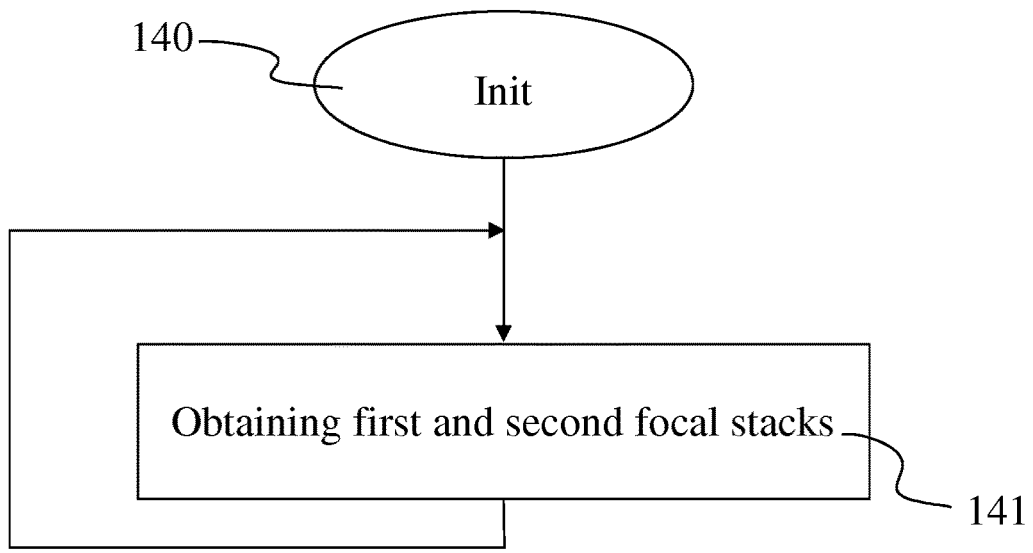
FIG. 14A shows a method of processing a lightfield image acquired with the lightfield camera of FIG. 1 or 2, according to a particular embodiment of the present principles.
Figure 14B:
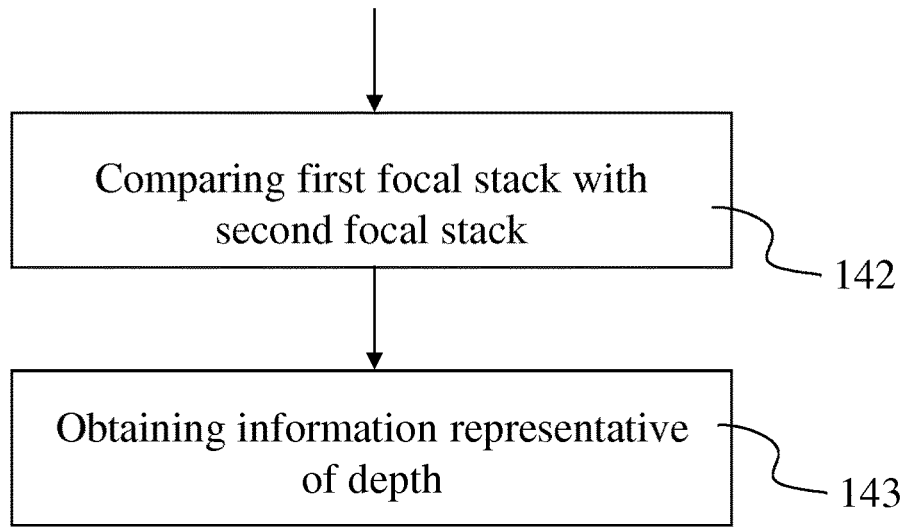
Figure 14C:
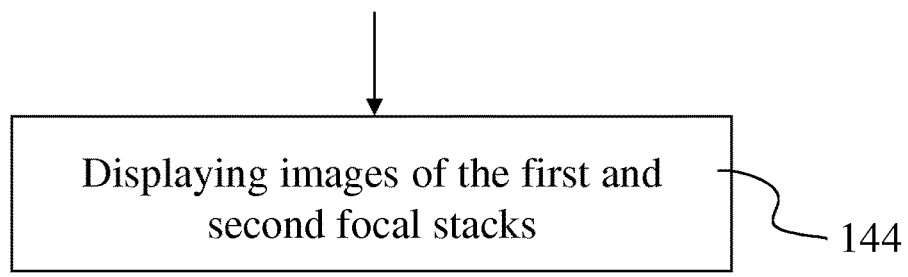

FIGS. 14B and 14C each show optional processing of the focal stacks obtained from the processing of the lightfield image of FIG. 14A, according to particular embodiments of the present principles.

5. DETAILED DESCRIPTION OF EMBODIMENTS

The subject matter is now described with reference to the drawings, wherein like reference numerals are used to refer to like elements throughout. In the following description, for purposes of explanation, numerous specific details are set forth in order to provide a thorough understanding of the subject matter. It can be evident, however, that subject matter embodiments can be practiced without these specific details.

According to a particular embodiment of the present principles, a first focal stack and a second focal stack are obtained, the first focal stack and the second focal stack each comprising images representative of a scene. The first images of the first focal stack being obtained from a first part of pixels of a lightfield image of the scene acquired with a lightfield acquisition device, such as a plenoptic camera or a multi-camera array. The second images of the second focal stack are obtained from a second part of the pixels of the lightfield image different from the first part of pixels. A depth value is associated with each first image and with each second image, in such a way that a same depth value is associated with one first image and the same depth value is associated with one second image, the first image and the second image having a same depth value forming a so-called pair of first and second images. A lightfield image corresponds for example to a raw image or to an image comprising different views of the scene.

Obtaining two such different focal stacks from a lightfield image enables to determine easily objects in focus for each pair of first and second images and/or to compute depth information associated with the lightfield image in a robust way.

Figure 1:
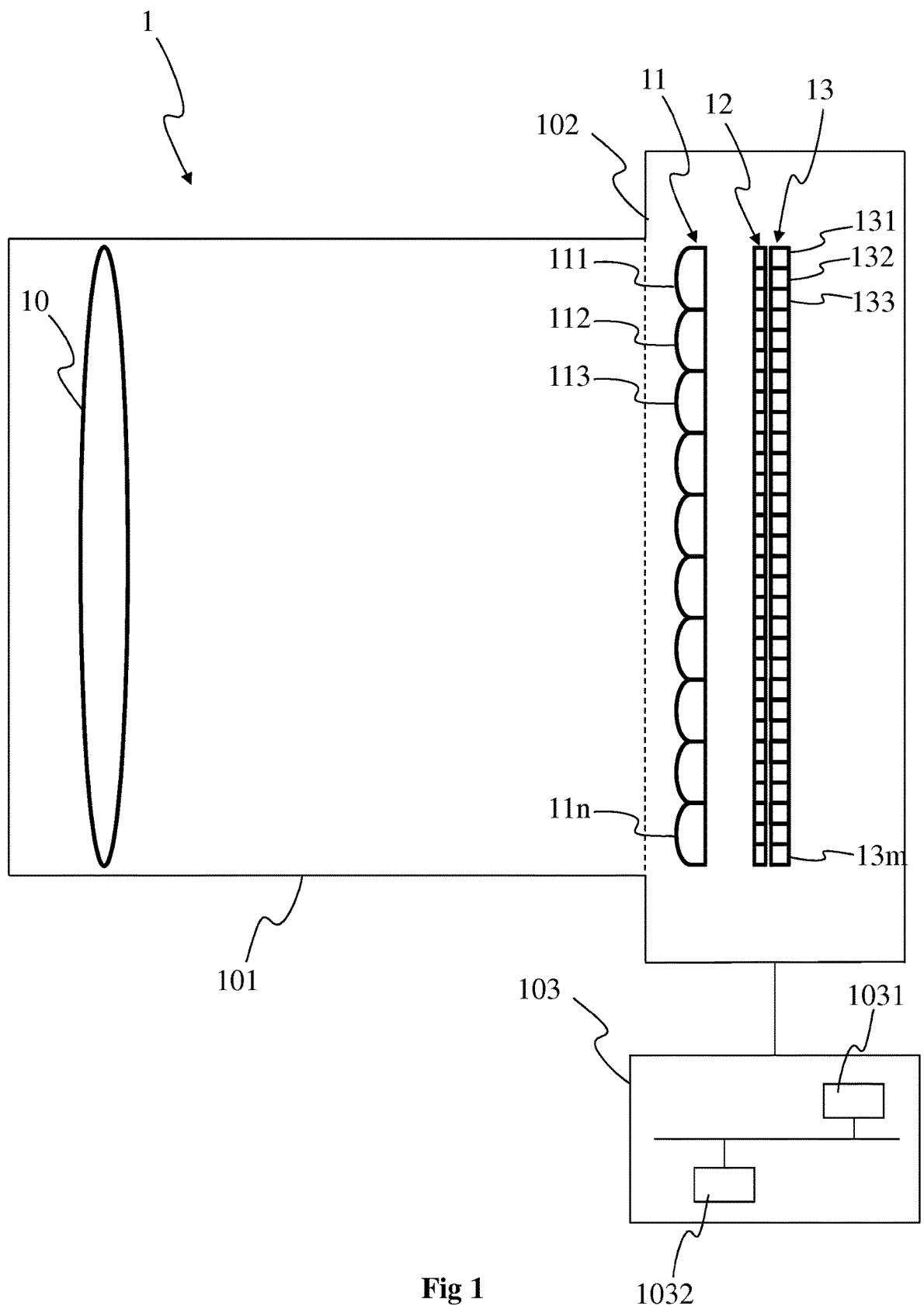
FIG. 1 shows a first example of a lightfield camera, according to a particular embodiment of the present principles.

FIG. 1 shows a first example of a lightfield acquisition device. More specifically, FIG. 1 shows a plenoptic camera 1, according to a particular embodiment of the present principles. The plenoptic camera 1 comprises a lens unit 101 (corresponding to an optical assembly) and a camera body 102.

The lens unit 101 is advantageously adapted to be associated with the camera body 102. The camera body 102 comprises a photosensor array 13, which comprises a plurality m of photosensors 131, 132, 133 to 13m. Each photosensor corresponds to a pixel of the raw image of the scene acquired with the photosensor array, with each pixel encompassing a part (also called a point) of the scene. Data representative of the scene obtained with each photosensor form a set of lightfield data, the lightfield data forming a lightfield image. Before processing of the raw image (before demultiplexing and/or demosaicing), the lightfield image may correspond to the raw image according to a non-limitative example. After demultiplexing of the raw image, the lightfield image may correspond to sub-aperture images according to another non-limitative example and after demosaicing the lightfield image may correspond to the set of views of the scene according to a further non-limitative example. For purposes of illustration, the photosensor array 13 is shown with a relative small number of photosensors 131 to 13m. Naturally, the number of photosensors is not limited by the illustration of FIG. 1 but extends to any number of photosensors, for example several thousand or several millions of photosensors. For example in a 12.4 megapixel camera, a pixel will correspond to a photosensor (e.g. corresponding to an array of 4088×3040 pixels/photosensors). A color filter array (CFA) 12 may be arranged on the photosensor array 13. The CFA 12 typically arranges RGB (Red, Green and Blue) color filters on the photosensor array, the RGB arrangement taking for the example the form of a Bayer filter mosaic. According to a variant, a CFA is arranged on the lenslet array 11 (in addition to the CFA 12 or in replacement of the CFA 12). For associating the lens unit 101 with the camera body 102, the lens unit 101 comprises a first attaching part and the camera body 102 comprises a second attaching part, the first and second attaching parts being compatible with each other. Thanks to the first and second attaching parts, the lens unit 101 may be clipped onto the camera body 102 or the lens unit 101 may be screwed with the camera body 102. An example of such first and second attaching parts of a lens unit configured to be associated with a camera body may be found in the Japanese patent application JP2013-105151A, which was published on May 30, 2013. The first and second attaching parts are configured in such a way that, once the lens unit 101 and the camera body 102 have been put together, the lens unit 101 and the camera body 102 form a plenoptic camera configured for acquiring multiple views of a scene at each acquisition of the scene. To this end, the camera body 102 also comprises a lenslet array 11 comprising n microlenses 111, 112, 113, 11n, n being an integer greater than or equal to 2. The lenslet array 11 is also called microlens array. For purposes of illustration, the lenslet array 11 is shown with a relative small number of microlenses, but the number of microlenses may extend up to several thousand or even one or several million of microlenses. A group of photosensors of the photosensor array 13 are optically associated with each microlens 111 to 11n of the lenslet array 11. For example, each microlens 111 to 11n of the lenslet array 11 is sized to correspond to an array of 2×1, 4×4 or 10×10 photosensors. A group of photosensors associated with a microlens (or said differently, a group of photosensors under the microlens) form a micro-image associated with this microlens, each photosensor of the group of photosensors forming a pixel of the micro-image. Each photosensor of the plurality of photosensors optically associated with one single microlens enables to acquire raw data representative of a pixel of the scene according to one position (acquisition of as many parallaxes as pixels). According to a variant, the lens unit 101 and the camera body 102 collectively form one single body and are assembled without being detachable.

The lens unit 101 comprises a camera lens 10, also called a main lens or primary lens, which is advantageously formed of one or more lens elements, only one lens element 10 being depicted in FIG. 1 for clarity purpose.

The plenoptic camera 1 advantageously comprises a hardware module 103 configured for detecting a change in one or more parameters of the camera lens 10, for example a change of the focal length of the camera lens and/or a change of the focussing distance occurring when focalizing or zooming. A change of the focal length of the camera lens and/or a change of the focussing distance occurring when focalizing or zooming results in a change of the distance between the camera lens 10 and the lenslet array 11. The hardware module is advantageously configured to perform the calibration of the plenoptic camera 1, i.e. by determining the center of each micro-image or of each microlens, as described with more details hereinafter. According to a variant, the hardware module is configured to store metadata comprising the coordinates of the centers of the micro-images and/or of the microlenses. The module may be comprised in the camera body 102 or in the lens unit 101. The module advantageously comprises one or several processors 1031 associated with a memory, for example Random Access Memory or RAM 1032 comprising one or more registers. The one or more processors 1031 correspond for example to a CPU (Central Processing Unit), one or more GPUs (Graphics Processing Unit) or a combination of CPU and GPUs. The memory or part of the memory stores instructions of one or more algorithms implementing the method of calibrating the plenoptic camera. The memory or part(s) of the memory may also be used to store lightfield data associated with the raw image, or lightfield data obtained from the processing of the raw image, such as for example data representative of the demultiplexed views or data representative of the sub-aperture images, i.e. images of the different views of the scene obtained from the demultiplexing and the demosaicing of the raw image. The memory or part(s) of the memory may also be used to store information representative of depth associated with the lightfield data, for example the pixels of the photosensor array, The information representative of depth may be stored under the form of a depth map or disparity map that comprises values of depth or disparity associated with each pixel of the depth map or the disparity map respectively.

According to a variant, the module 103 takes the form of a programmable logical circuit of type FPGA (Field-Programmable Gate Array) for example, ASIC (Application-Specific Integrated Circuit) or a DSP (Digital Signal Processor). The module 103 may also comprise an interface configured to receive and transmit data such as control parameters input by a user via a user interface to set the plenoptic camera 1, the user interface being for example displayed on a display screen (for example a LCD or an OLED display) arranged for example on the camera body 102.

Figure 3:
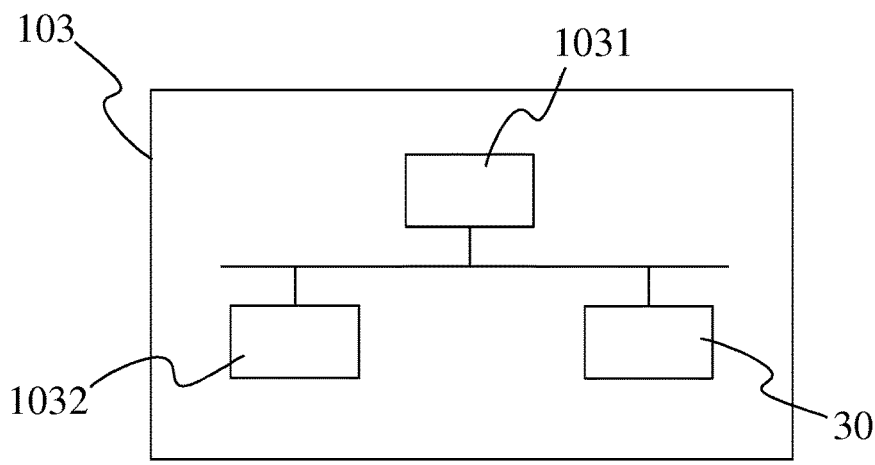
FIG. 3 shows a processing unit configured to process data provided by the lightfield camera of FIG. 1 or 2, according to a particular embodiment of the present principles.

According to a variant and as illustrated in the exemplary embodiment of FIG. 3, the module 103 is not comprised in the plenoptic camera but connected to the plenoptic camera via a wired connection (for example via USB (Universal Serial Bus)) or via a wireless connection (for example via Bluetooth, Wi-Fi or ZigBee). According to this variant, the module advantageously comprises a transmitter 30 to exchange data with the plenoptic camera in addition to the memory 1032 and to the one or more processors 1031.

The plenoptic camera 1 is equally of the type 1.0, corresponding to a plenoptic camera wherein the distance between the lenslet array 11 and the photosensor array 13 is equal to the microlenses focal length, or of the type 2.0 otherwise (also called focused plenoptic camera).

Figure 2:
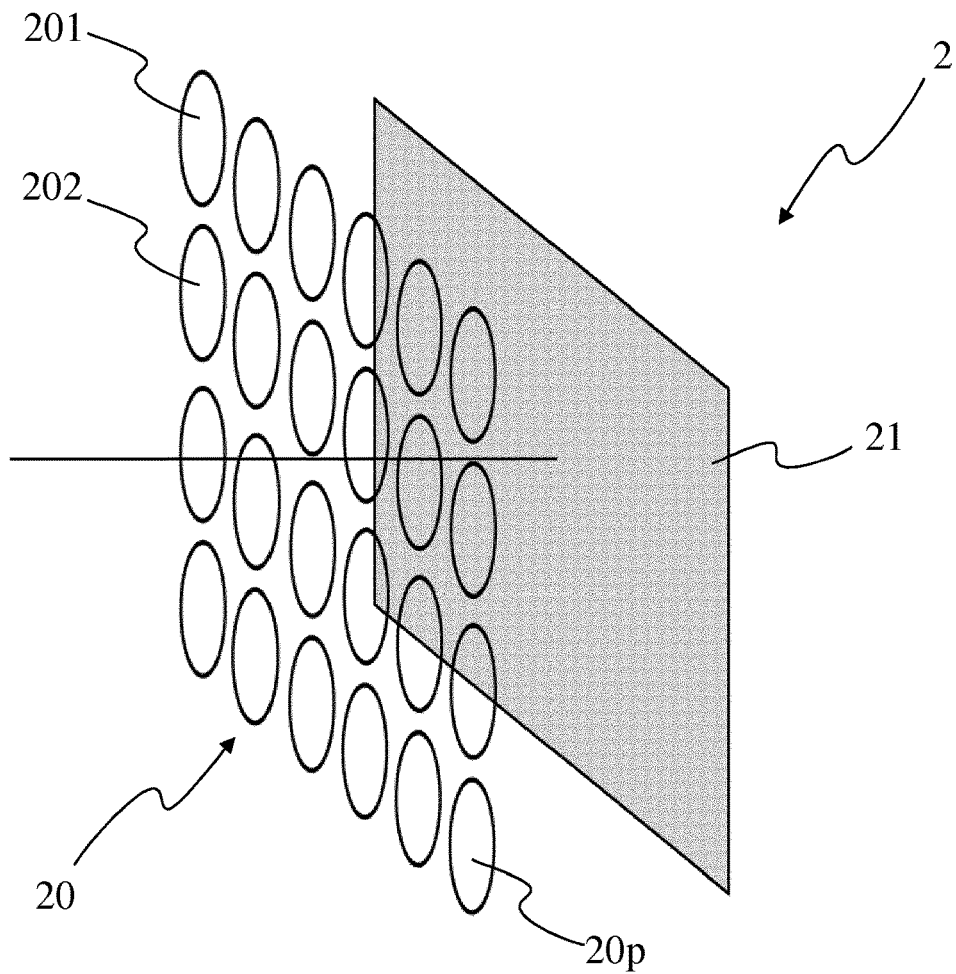
FIG. 2 shows a second example of a lightfield camera, according to a particular embodiment of the present principles.

FIG. 2 shows a second example of a lightfield acquisition device. More specifically, FIG. 2 shows a multi-camera array 2, according to a particular embodiment of the present principles.

The multi-camera array 2 comprises an array of lenses or micro-lenses, referenced 20, comprising several micro-lenses referenced 201, 202 to 20p with p being an integer corresponding to the number of micro-lenses, and one or several sensor arrays, referenced 21. The multi-camera array 2 is without main lens. The array of micro-lenses is often a small device, which is commonly named a micro-lens array. It is worth noting that the multi-camera array with a single sensor can be considered as a special case of plenoptic camera where the main lens has an infinite focal. According to a particular arrangement wherein the number of photo-sensors is equal to the number of micro-lenses, i.e. one photosensor is optically associated with one micro-lens, the multi-camera array may be seen as an arrangement of several individual cameras (for example micro-cameras) closely spaced from each other, such as a square arrangement (as illustrated in FIG. 2) or a quincunx arrangement for example.

The lightfield data (forming a so-called lightfield image) obtained with such a multi-camera array 2 corresponds the plurality of views of the scene, i.e. to the final views obtained by demultiplexing and demosaicing of the raw image obtained with a plenoptic camera such as the plenoptic camera of FIG. 1.

Figure 4:
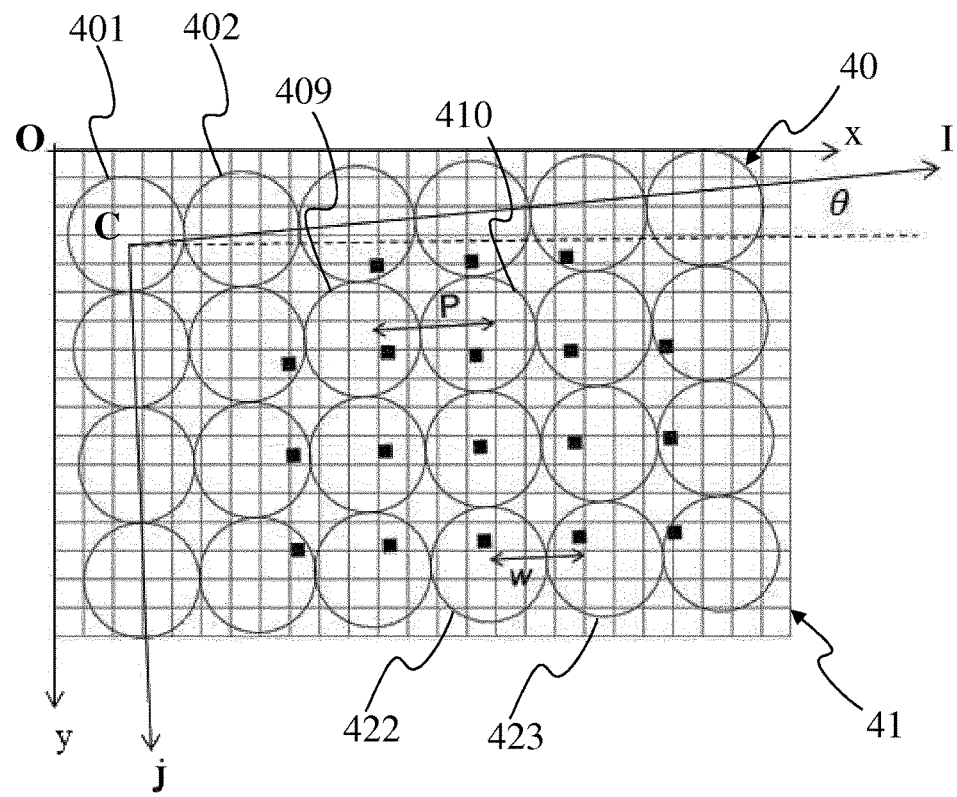
FIG. 4 shows lightfield data obtained with a photosensor of the lightfield camera of FIG. 1 or 2, according to a particular embodiment of the present principles.

FIG. 4 shows lightfield data obtained with the photosensor array of the lightfield camera of FIG. 1 or 2, according to a particular embodiment of the present principles.

The photosensor array 41, for example the photosensor array 13 or the photosensor array(s) 21, of the lightfield camera, for example the lightfield camera 1 or 2 respectively, acquires a lightfield image which is made of a collection of 2D sub-images arranged within a 2D image, each sub-image being called micro-lens image as each sub-image is generated by a micro-lens 401, 402, 422, 423 to 40q from the array 40 of micro-lenses, q being an integer corresponding to the number of micro-lenses. The array of micro-lenses 40 corresponds for example to the lenslet array 11 of FIG. 1 or to the array of micro-lenses 20 of FIG. 2. Each micro-lens 401 to 40q covers some pixels of the photosensor array 41 forming a so-called micro-lens image. Each micro-lens image has the form of the shape of the micro-lens, which with it is optically associated, for example a circle in the example of FIG. 4. Pixel coordinates are labelled (x,y) and are expressed in the coordinate system (CS) of the photosensor array 41, also called Cartesian CS. The Cartesian CS corresponds to the coordinate system (0, x, y) with 0 the origin of the coordinate system, [0,x[ the horizontal axis and [0,y[ the vertical axis. p corresponds to the distance between 2 consecutive micro-lens images, for example to the distance between the centers of two consecutive micro-lens images 409, 410 located on a same row of micro-lens images. Micro-lenses are chosen such that p (in pixel coordinate) is larger than a pixel size δ, δ corresponding for example to the length of an edge of the pixel. The micro-lens images are referenced by their coordinate (i,j) in the coordinate system of the microlenses, called microlens CS and corresponding to the coordinate system (C,i,j) with C the origin of the coordinate system, [C,i[ the horizontal axis and [C,j[ the vertical axis. Some pixels of the array 41 might not receive any light from any micro-lens; those pixels are discarded. Indeed, the inter micro-lens space may be masked out to prevent photons to pass outside from a micro-lens (if the micro-lenses have a square shape, no masking is needed). The center of a micro-lens image (i,j) is located on the photosensor array at the coordinate $(x_{i,j}, y_{i,j})$. θ corresponds to the rotational offset between the Cartesian CS and the microlens CS, i.e. θ is the angle between the square lattice of pixels forming the photosensor array 41 and the square lattice of micro-lenses 40. The $(x_{i,j}, y_{i,j})$ coordinates are for example computed with the following equation (assuming that micro-lenses are arranged according to a square lattice) considering $(x_{0,0}, y_{0,0})$ the pixel coordinate of the micro-lens image (0,0):

$$\begin{bmatrix} x_{i,j} \\ y_{i,j} \end{bmatrix} = p \begin{bmatrix} \cos\theta & -\sin\theta \\ \sin\theta & \cos\theta \end{bmatrix} \begin{bmatrix} i \\ j \end{bmatrix} + \begin{bmatrix} x_{0,0} \\ y_{0,0} \end{bmatrix} \quad \text{Equation 1}$$

FIG. 4 also illustrates that an object from the scene is visible on several contiguous micro-lens images (dark dots). The distance between 2 consecutive views of an object is w (in pixel coordinate), this distance corresponding to the disparity. An object is visible on r consecutive micro-lens images with:

$$r = \left\lfloor \frac{p}{|p-w|} \right\rfloor \quad \text{Equation 2}$$

wherein r is the number of consecutive micro-lens images in one dimension. An object is visible in $r^2$ micro-lens images. Depending on the shape of the micro-lens image, some of the $r^2$ views of the object might be invisible.

Naturally, the shape of a micro-lens is not limited to a circle but may be any other shape, for example a square, a rectangle, an hexagon.

Figure 6A:
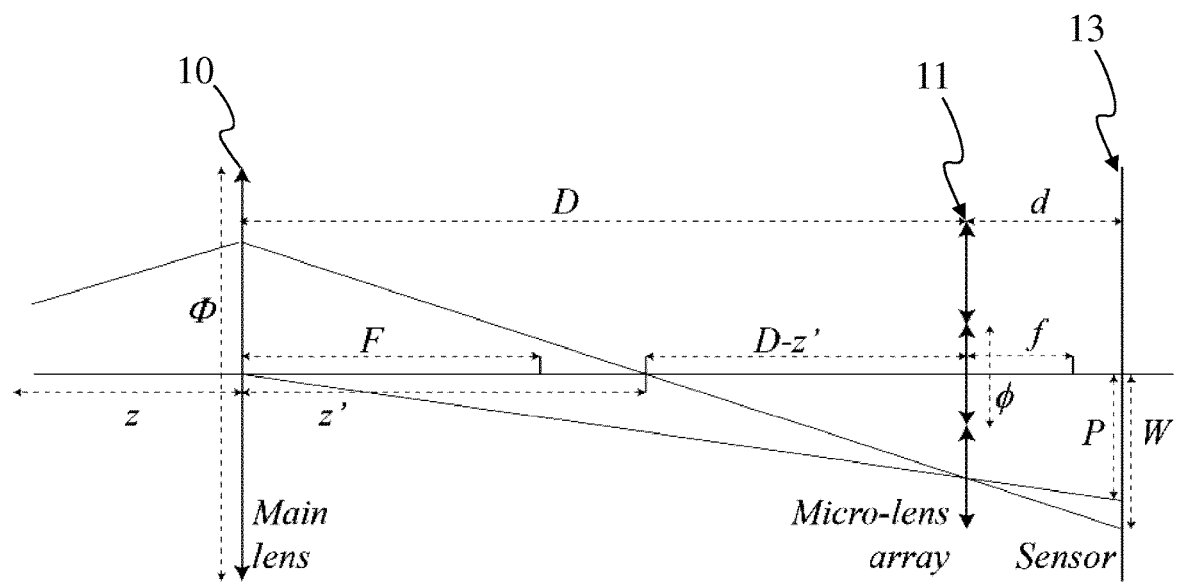
FIGS. 6A and 6B show optical properties of the lightfield camera of FIG. 1, according to particular embodiments of the present principles.
Figure 6B:
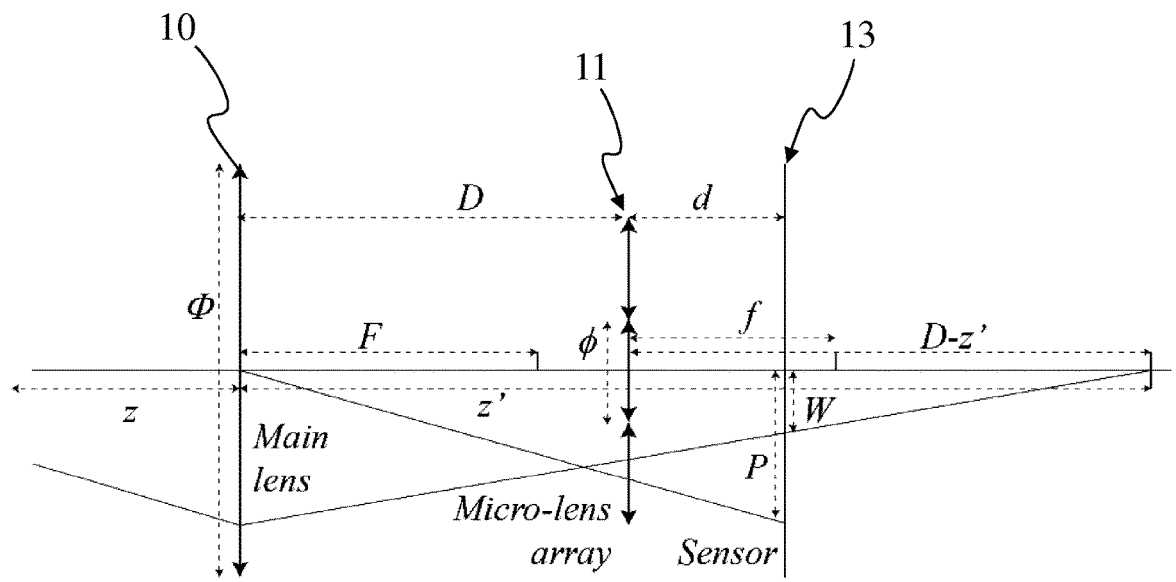

FIGS. 6A and 6B show optical properties of the lightfield camera of FIG. 1 or 2, according to particular embodiments of the present principles. According to the particular embodiment of FIG. 6A, W>P and according to the particular embodiment of FIG. 6B, W<P. The distances p and w introduced with regard to FIG. 4 are given in unit of pixels. p and w are converted into physical unit distance (meters), respectively P and W by multiplying p and w by the pixel size δ: W=wδ and P=pδ. These distances depend from the light-field camera characteristics.

FIGS. 6A and 6B each illustrates a schematic light-field assuming perfect thin lens model. The main-lens 10 has a focal length F and an aperture ϕ. The micro-lens array 11 is made of micro-lenses having a focal length f. The pitch of the micro-lens array is ϕ. The micro-lens array is located at a distance D from the main-lens, and a distance d from the photosensor array 13. The object (not illustrated in FIGS. 6A and 6B) is located at a distance z from the main-lens (on the left-hand side of the main lens). This object is focused by the main-lens at a distance z' from the main-lens (on the right-hand side of the main lens). FIGS. 6A and 6B illustrate the cases where respectively D>z' and D<z'. In both cases, micro-lens images can be in focus depending on d and f.

The disparity W varies with the distance z of the object. To establish the relation between W and z, thin lens equation is used:

$$\frac{1}{z} + \frac{1}{z'} = \frac{1}{F} \qquad \text{Equation 3}$$

And the Thales law:

$$\frac{D-z'}{\phi} = \frac{D-z'+d}{W} \qquad \text{Equation 4}$$

Mixing the equations 3 and 4, we obtain:

$$W = \phi\left(1 + \frac{d}{D - \frac{zF}{z-F}}\right) \qquad \text{Equation 5}$$

Equation 5 is reversed to express z as a function of W:

$$Z = \frac{1}{\frac{1}{F} - \frac{1}{D + d\frac{\phi}{\phi - \delta w}}} \qquad \text{Equation 6}$$

The relation between W and z does not assume that the micro-lens images are in focus. Micro-lens images are strictly in focus according to the thin lens equation:

$$\frac{1}{D-z'} + \frac{1}{d} = \frac{1}{f} \qquad \text{Equation 7}$$

Also from the Thales law one derives P:

$$e = \frac{D+d}{D} \qquad \text{Equation 8}$$
$$P = \phi e$$

The ratio e defines the enlargement between the micro-lens pitch and the micro-lens images pitch. This ratio is very close to 1 since D>>d.

In the particular case of a lightfield camera corresponding to a multi-camera array 2 as described with regard to FIG. 2, it is considered that F tends to infinity and D may be chosen with a value equal to 0 for example. With such assumption, equations 3 to 8 also apply for multi-camera arrays.

Figure 5A:
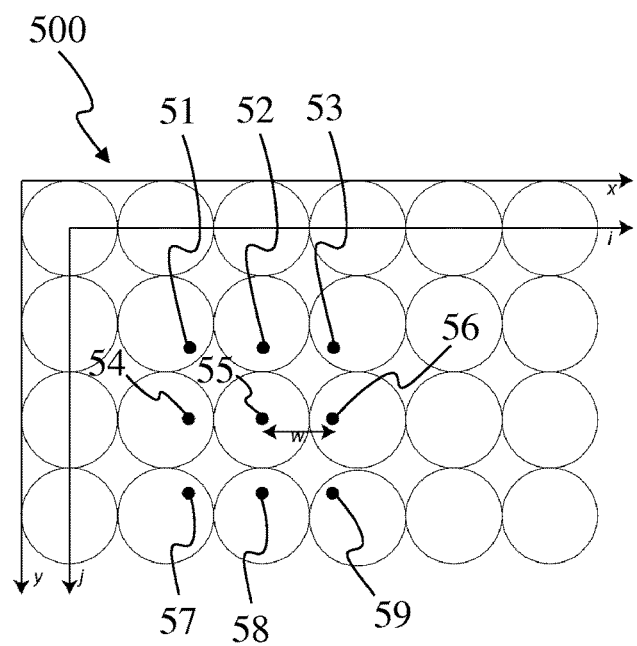
FIGS. 5A and 5B show the projection of the lightfield data of FIG. 4 into a 2D refocused image, according to a particular embodiment of the present principles.
Figure 5B:
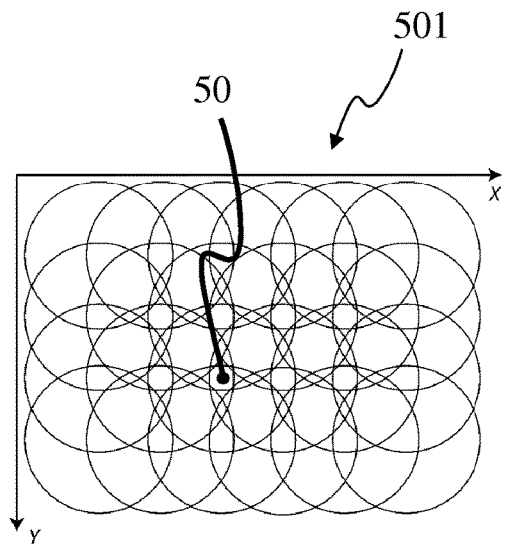

FIGS. 5A and 5B show the projection of the lightfield data of FIG. 4 into a 2D refocused image 501, according to a particular embodiment of the present principles.

A major property of the lightfield camera is the ability to obtain 2D re-focused images where the re-focalization distance is freely adjustable after the acquisition of the scene. The lightfield image 500 comprising the lightfield data is projected into a 2D image 501 by just shifting and zooming micro-lens images comprised in the lightfield image 500 and then summing them into the 2D image 501, called refocus 2D image, according to a determined re-focalization distance. The amount of shift controls the re-focalization distance. The projection of a lightfield pixel of coordinates (x,y,i,j), i.e. a pixel of the lightfield image 500 (also called 4D lightfield pixel as expressed in the Cartesian CS with coordinates (x,y) and in the microlens CS with coordinates (i,j) corresponding to the indices of the microlens it belongs to), for example pixels 51 to 59 shown with a black dot, into a corresponding pixel of coordinates (X,Y) in the re-focus 2D image 501, also shown with a black dot 50, is defined with:

$$\begin{bmatrix} X \\ Y \end{bmatrix} = sg\left(\begin{bmatrix} x \\ y \end{bmatrix} - \begin{bmatrix} x_{i,j} \\ y_{i,j} \end{bmatrix}\right) + s\begin{bmatrix} x_{i,j} \\ y_{i,j} \end{bmatrix} \qquad \text{Equation 9}$$

s controls the size of the 2D re-focused image 501, and g controls the focalization distance of the 2D re-focused image 501. This equation is rewritten as follow, considering equation 1:

$$\begin{bmatrix} X \\ Y \end{bmatrix} = sg\begin{bmatrix} x \\ y \end{bmatrix} + sp(1-g)\begin{bmatrix} \cos\theta & -\sin\theta \\ \sin\theta & \cos\theta \end{bmatrix}\begin{bmatrix} i \\ j \end{bmatrix} + s(1-g)\begin{bmatrix} x_{0,0} \\ y_{0,0} \end{bmatrix} \qquad \text{Equation 10}$$

The parameter g may be expressed as function of p and w. g is the zoom that must be performed on the micro-lens images, using their centers as reference, such that the various zoomed views of the same objects gets superposed:

$$g = \frac{p}{p-w} \qquad \text{Equation 11}$$

Equation 10 becomes:

$$\begin{bmatrix} X \\ Y \end{bmatrix} = sg\begin{bmatrix} x \\ y \end{bmatrix} - sqw\begin{bmatrix} \cos\theta & -\sin\theta \\ \sin\theta & \cos\theta \end{bmatrix}\begin{bmatrix} i \\ j \end{bmatrix} + \frac{sgw}{p}\begin{bmatrix} x_{0,0} \\ y_{0,0} \end{bmatrix} \qquad \text{Equation 12}$$

The 4D light field pixels (x,y,i,j) are projected into the 2D refocused image 501. Preliminarily a refocused image R and a refocused image weight $R_{weight}$ are set to 0. The size of the refocused images $[N_x,N_y]=[sN_x,sN_y]$ is set to s times the size of the lightfield image. The projection is performed by summing the projected pixels at the coordinate (X,Y) into the 2D re-focused image 501. For each 4D light-field pixels projected, the refocused image weight is updated by adding 1 at the pixel coordinate (X,Y):

$$R(X, Y) += L(x, y, i, j) \qquad \text{Equation 13}$$
$$R_{weight}(X, Y) += 1$$

The refocused image weight records how many 4D light-field pixels have been projected per coordinate (X,Y). After projecting all 4D light-field pixels of L, the refocused image R 501 is divided by the refocused image weight $R_{weight}$. This last step harmonizes the number of pixels received per coordinate (X,Y).

Since the projected coordinates (X,Y) are not necessarily integer coordinates, interpolation process may be optionally used to map a non-integer pixel coordinate (X,Y) into the grid of the refocused image R 501 and refocused image weight $R_{weight}$. Interpolation technique known by the skilled person in the art is used, such as for example Bilinear Interpolation.

Figure 7:
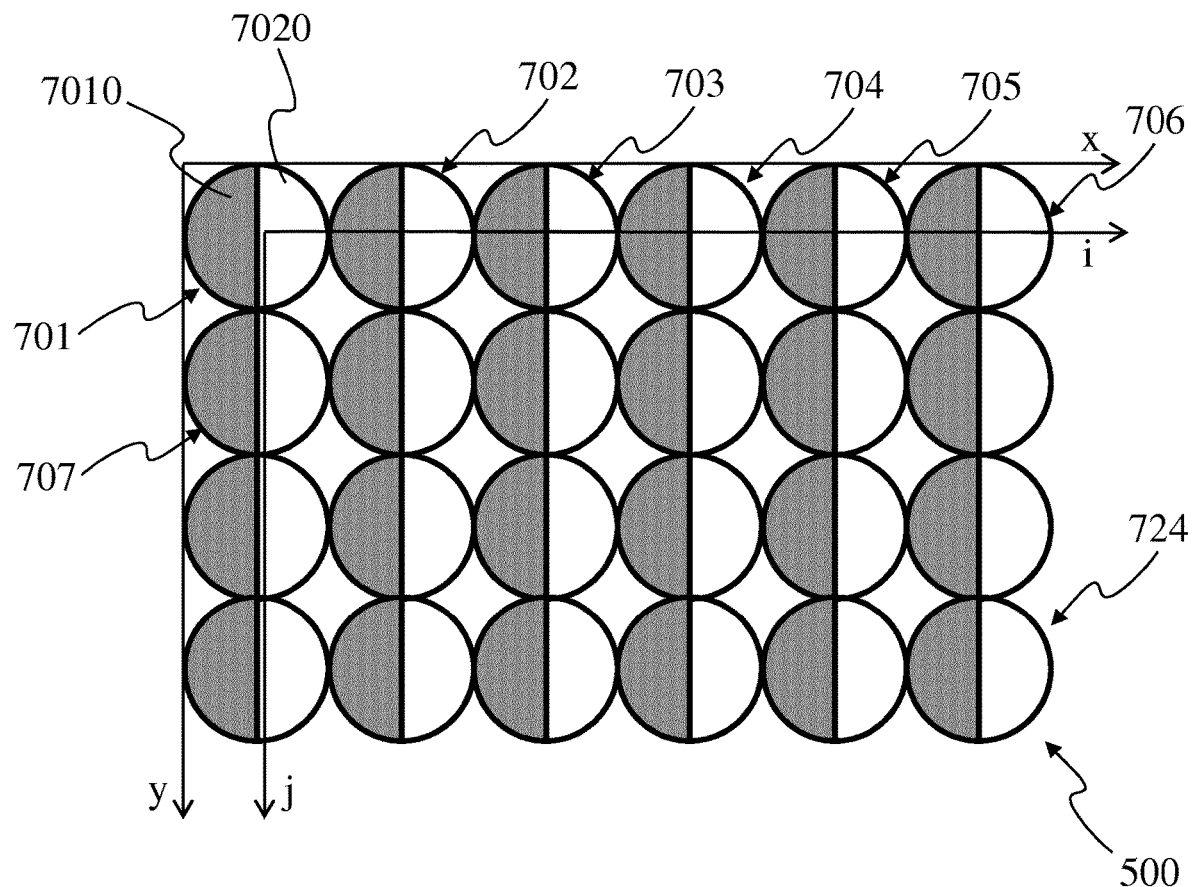
FIGS. 7 and 8 show a selection of parts of the lightfield data of FIG. 5 to obtain first and second focal stacks of FIG. 9, according to a particular embodiment of the present principles.
Figure 8:
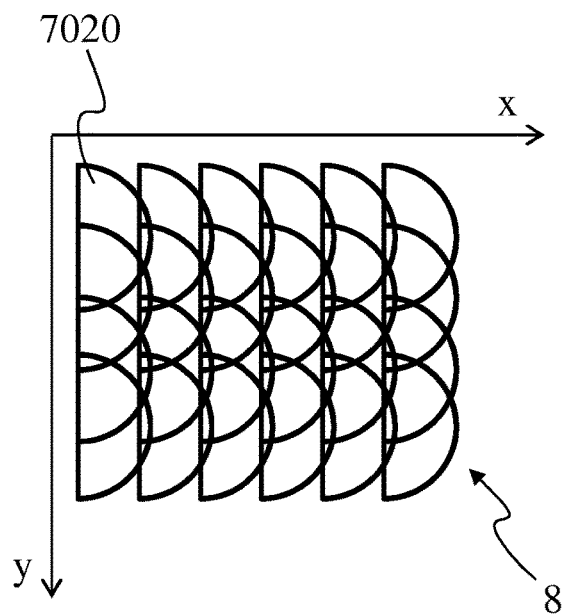

FIGS. 7 and 8 show a selection of parts of the microlens images of the lightfield image 500 to obtain first and second focal stacks of FIG. 10, according to a particular embodiment of the present principles.

FIG. 7 shows the microlens images 701 to 724 of the lightfield image 500, each microlens image being divided into two parts 7010, 7020, each part 7010, 7020 of a microlens image 701 corresponding to a half of the microlens image, both halves 7010, 7020 forming the whole microlens image 701. The embodiment of FIG. 7 corresponds advantageously to microlens images 701 to 724 of a lightfield image 500 (also called raw image according to this embodiment) obtained with a plenoptic camera such as the one illustrated in FIG. 1. According to the embodiment of FIG. 7, each microlens image 701 to 724 is divided into two halves, each microlens image being partitioned into two complementary parts with a same number of pixels of the microlens image according to the vertical axis. For example, the microlens image 701 comprises a first half, for example a left-hand side half 7010 and a second half, for example a right-hand side half 7020. The first halves of the microlens images are filled with grey background and the second halves of the microlens images are filled with white background. The first half 7010 is different from the second half 7020 and the first half 7010 and the second half 7020 are complementary, meaning that the surface covered by the first half 7010 (or, respectively, the pixels comprised in the first half 7010) and the second half 7020 (or, respectively, the pixels comprised in the first half 7020) corresponds to the whole surface (or, respectively, to the whole pixels) of the microlens image 701 comprising both first and second halves.

Naturally, the partition of the microlens images into two halves is not limited to the vertical partition but extends to any partition into two halves. FIGS. 11A and 11B show two other different orientations of the partition of the microlens images, according to particular and non-limitative embodiments of the present principles. The microlens image 701 is used as an example. In FIG. 11A, the microlens image 701 is partitioned according to the horizontal axis, a first half 1101 corresponding to the upper half and a second half 1102 corresponding to the lower half. In FIG. 11B, the microlens image 701 is partitioned according to a diagonal axis, for example an axis forming an angle of 45° with the horizontal axis, a first half 1103 corresponding to the upper half and a second half 1104 corresponding to the lower half.

The orientation of the partition of the microlens images is either predetermined (for example set by the manufacturer of the lightfield camera) or an adjustable parameter that may be set by a user via a user interface.

According to a variant, the orientation of the partition of the microlens images is set automatically according to an information representative of the orientation of one or more objects of the scene. The scene is for example analysed via image processing and the orientation of each object is determined. The orientation of the partition is for example set to the majority orientation of the objects. According to a variant, the orientation of the partition corresponds to the orientation of the object of interest of the scene, the object of interest being for example determined by using saliency information or corresponding to the object closest to the center of the scene.

FIG. 8 shows a 2D-refocused image 8 obtained from the right-hand side halves of the microlens images 701 to 724 for a determined focalization distance. The 2D-refocused image 8 is advantageously generated by using the refocalization process described with regard to FIGS. 5A and 5B, for a particular focalization distance g. To generate the focal stacks of FIG. 10, several 2D-refocused images are generated as the image 8 with for each a different value of g, as described with more details with regard to FIG. 10.

FIG. 10 shows a first focal stack 1000A and a second focal stack 1000B, according to a particular and non-limitative embodiment of the present principles.

A focal stack is a collection of N re-focused images R(n) (with n∈[1,N]) which define a cube of images, where N is a determined number of images. The N re-focused images are computed for g varying linearly between $g_{min}$ and $g_{max}$ corresponding to a range of focalization distances between $z_{min}$ and $z_{max}$ defined by equation 11. Another option is to compute the focal stack with w varying linearly from $w_{min}$ and $w_{max}$ corresponding to a range of focalization distances between $z_{min}$ and $z_{max}$ defined by equation 6. The min max boundaries of g or w are for example set by a user in order to encompass re-focused images with a focalization distance within $z_{min}$ and $z_{max}$. According to a variant, the min max boundaries of g or w are associated with the lightfield camera and for example fixed by the manufacturer. z(n) indicates the distance of the refocused image for image index n.

The first focal stack 1000A comprises a plurality of first images 1001A to 1007A, a determined and different focalization distance g being associated with each first image 1001A to 1007A. As there is a close relationship between the depth z and the focalization distance g (as given by equation 6), it is equivalent to say that a different value of depth is associated with each first image 1001A to 1007A. The focalization distances associated with the first images 1001A to 1007A advantageously belong to a range of focalization distances, the lower limit of the range corresponding to $g_{min}$ and the upper lower limit of the range corresponding to $g_{max}$. $g_{min}$ is for example associated with the first image 1001A of the stack and $g_{max}$ is for example associated with the last first image 1007A of the first stack 1000A. The focalization distances associated with the other first images 1002A to 1006A are chosen within the range $[g_{min}, g_{max}]$ by scanning the range from $g_{min}$ to $g_{max}$. According to this example, the focalization distances are associated with the first images 1001A to 1007A of the first stack 1001A according to an ascending order from $g_{min}$ to $g_{max}$. According to a variant, $g_{max}$ is associated with the first image 1001A and $g_{min}$ with the first image 1007A. According to this variant, the focalization distances are associated with the first images 1001A to 1007A of the first stack 1001A according to a descending order from $g_{max}$ to $g_{min}$. The values of g are for example associated with the first images in a regular way, i.e. the difference between two values of g associated with two consecutive first images is constant, i.e. we have:

$$g_{1002A} - g_{1001A} = g_{1003A} - g_{1002A} = \cdots = g_{1007A} - g_{1006A}$$

According to a variant, the difference between two values of 'g' associated with two consecutive first images is not constant but may vary from a pair of first images to another one, i.e.:

$$g_{1002A} - g_{1001A} \neq g_{1003A} - g_{1002A} \neq \cdots \neq g_{1007A} - g_{1006A}$$

According to another variant, some of the differences are equal and some are not, i.e.:

$$g_{1002A} - g_{1001A} = g_{1003A} - g_{1002A} \neq g_{1004A} - g_{1003A} \cdots \neq g_{1007A} - g_{1006A}$$

In a same way, the second focal stack 1000B comprises a plurality of second images 1001B to 1007B, a determined and different focalization distance g being associated with each second image 1001B to 1007B. The number of second images 1001B to 1007B is advantageously equal to the number of first images 1001A to 1007A. According to a variant, the number of second images 1001B to 1007B is different from the number of first images 1001A to 1007A, for example lower than the number of first images 1001A to 1007A or greater than the number of first images 1001A to 1007A. In a same way that a different focalization distance is associated with each first image 1001A to 1007A, a different focalization distance is also associated with each second image 1001B to 1007B. The set of focalization distances associated with the second images 1001B to 1007B is advantageously the same as the set of focalization distances associated with the first images 1001A to 1007A. For each focalization distance associated with a second image, it exists one first image in the first focal and a corresponding one second image in the second focal stack having the same focalization distance associated with. The first image and the corresponding second image are advantageously obtained with the same parameters g and s or with parameters g and s of close values. According to a variant, the set of focalization distances associated with the second images 1001B to 1007B is advantageously different from the set of focalization distances associated with the first images 1001A to 1007A. According to this variant, it also exists pairs of images composed of one first image and one second image for which the focalization distances associated with the first image and the second image forming the pair is the same.

For example, the first image 1001A and the second image 1001B have the same focalization distance; the first image 1002A and the second image 1002B have the same focalization distance; the first image 1003A and the second image 1003B have the same focalization distance; the first image 1004A and the second image 1004B have the same focalization distance; the first image 1005A and the second image 1005B have the same focalization distance; the first image 1006A and the second image 1006B have the same focalization distance; and the first image 1007A and the second image 1007B have the same focalization distance.

The first focal stack 1000A and the second focal stack 1000B are for example received by the processing unit 103 from a remote storage device or from the lightfield camera 1 or 2.

According to another example, the first focal stack is obtained from the first halves of each microlens images 701 to 724 as explained with regard to FIGS. 7 and 8 by applying the re-focalization process explained with regard to FIGS. 5A and 5B, by using a different focalization distance for each first image. In a same way, the second focal stack is obtained from the second halves of each microlens images 701 to 724 as explained with regard to FIGS. 7 and 8 by applying the re-focalization process explained with regard to FIGS. 5A and 5B, by using a different focalization distance for each first image.

Naturally, the number of first images and the number of second images is not limited to 7 but extends to any number greater than or equal to 2.

Figure 9A:
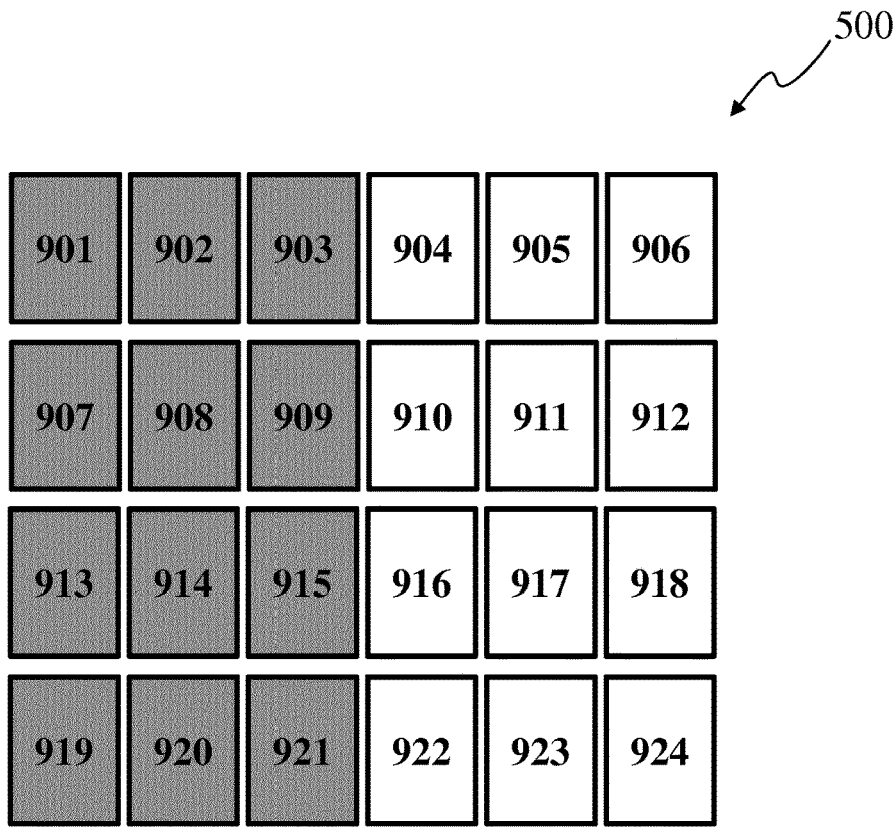
FIGS. 9A and 9B show the selection of views of a matrix of views obtained from the lightfield camera of FIG. 1 or 2, according to particular embodiments of the present principles.
Figure 9B:
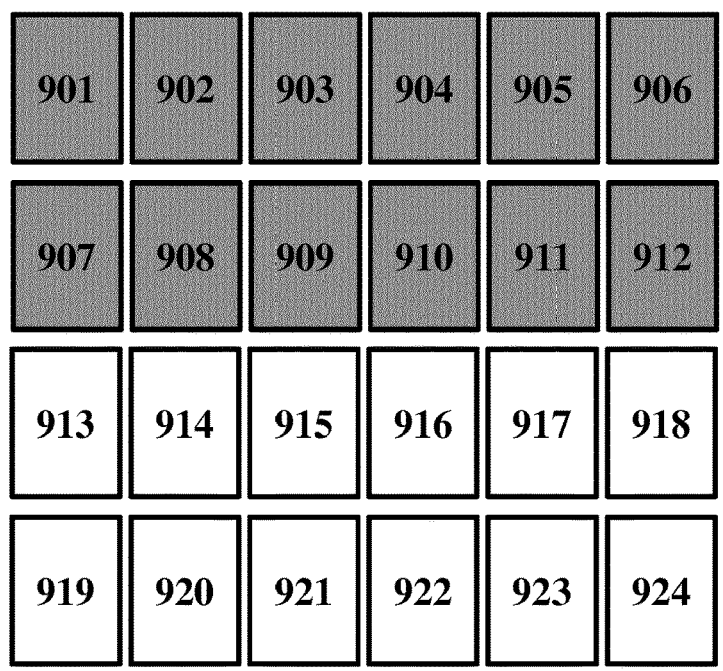

FIGS. 9A and 9B show a selection of parts of the microlens images of the lightfield image 500 to obtain the first and second focal stacks of FIG. 10, according to particular embodiments of the present principles. The embodiments of FIGS. 9A and 9B corresponds more specifically to the case where the lightfield image is obtained from a multi-camera array as the one described with regard to FIG. 2. According to this embodiments, the microlens images 901 to 924 correspond to different views of the scene according to different points of view, each camera of the multi-camera array 2 acquiring a different view of the scene. According to this embodiment, the lightfield image 500 corresponds to a matrix of views 901 to 924 or an array of views 901 to 924.

To obtain the first focal stack 1000A, a first half of the views is selected, for example the left-hand side half of the views according to the example of FIG. 9A, i.e. the views 901 to 903, 907 to 909, 913 to 915 and 919 to 921 filled with grey as background. According to the example of FIG. 9B, the first half of the views correspond to the upper part of the views, i.e. the views 901 to 912. The re-focalization process described with regard to FIGS. 5A and 5B is used based on the first part of the views to generate the first focal stack 1000A.

To obtain the second focal stack 1000B, a second half of the views is selected, for example the right-hand side half of the views according to the example of FIG. 9A, i.e. the views 904 to 906, 910 to 912, 916 to 918 and 922 to 924 filled with white as background. According to the example of FIG. 9B, the second half of the views correspond to the lower part of the views, i.e. the views 913 to 924. The re-focalization process described with regard to FIGS. 5A and 5B is used based on the second part of the views to generate the second focal stack 1000B.

The number of views of the first half is equal to the number of views of the second half, the set of views forming the first half being different from the set of views forming the second half. Some of the views comprised in the first half may also be comprised in the second half, depending on the orientation of the partition of the array of views and on the number of views comprised in the array of views. For example, if the partition of the array of views is performed according to a diagonal, the views located along the diagonal axis may belong to both the first half and the second half if the array of views cannot be divided in two equal halves of views without sharing some of the views between the first half and the second half. The first half is different from the second half of views, meaning that at last one of the view of the first half does not belong to the second half.

Figure 13:
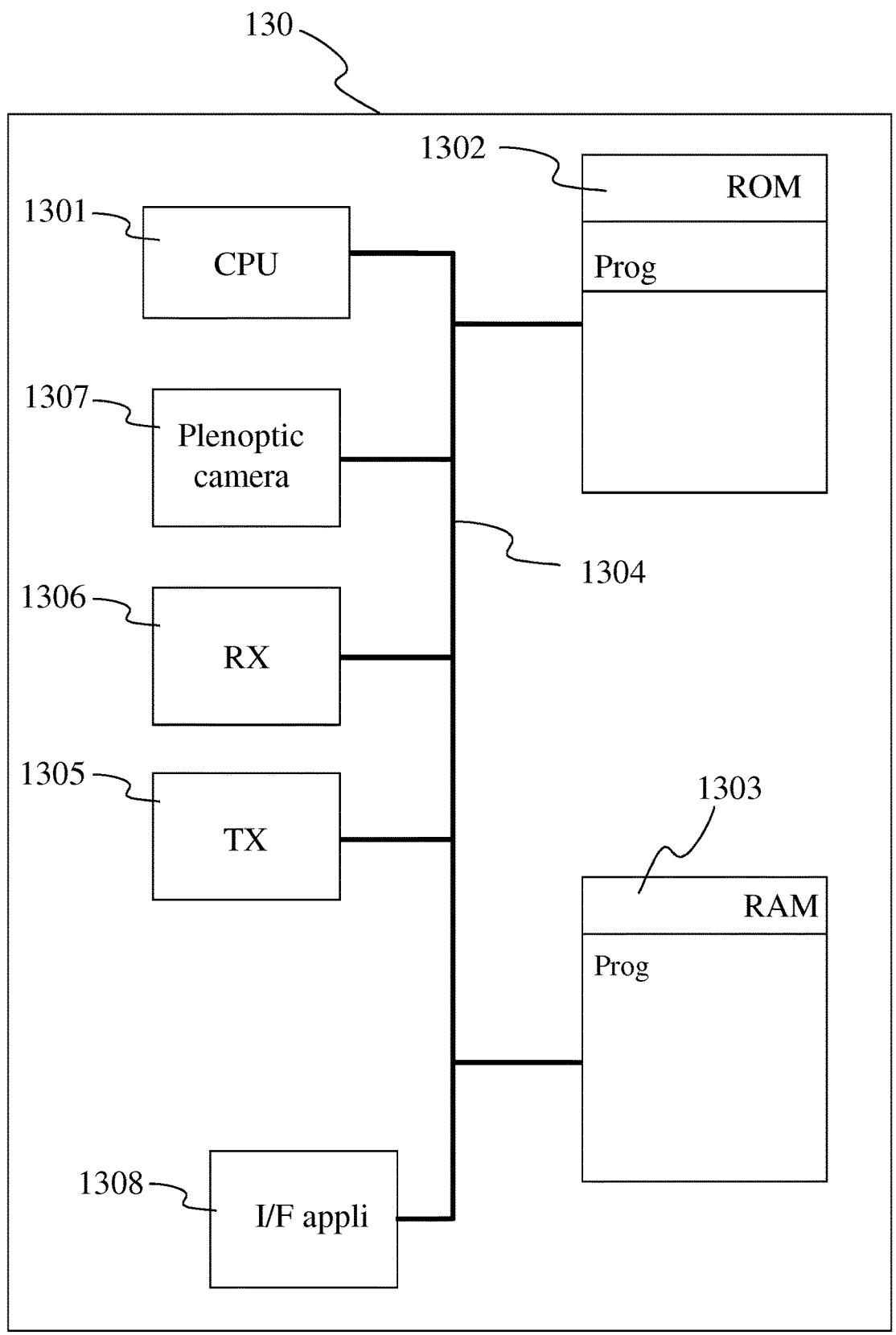
FIG. 13 shows a telecommunication device comprising the plenoptic camera of FIG. 1 or the multi-camera array of FIG. 2, according to a particular embodiment of the present principles.

FIG. 13 diagrammatically illustrates a hardware embodiment of a telecommunication device 130, corresponding for example to a smartphone or a tablet that embodies a lightfield camera in accordance with an aspect of the present principles.

The telecommunication device 130 comprises the following elements, connected to each other by a bus 1304 of addresses and data that also transports a clock signal:
- a microprocessor 1301 (or CPU),
- a non-volatile memory of ROM (Read Only Memory) type 1302,
- a Random Access Memory or RAM 1303,
- a radio interface 1306,
- an interface 1305 adapted for the transmission of data,
- a lightfield camera 1307, corresponding for example to the plenoptic camera 1 of FIG. 1 or to the multi-camera array 2 of FIG. 2, an MMI (Man Machine Interface) 1308 adapted for displaying information for a user and/or inputting data or parameters.

It is noted that the word "register" used in the description of memories 1302 and 13603 designates in each of the memories mentioned, a memory zone of low capacity as well as a memory zone of large capacity (enabling a whole programme to be stored or all or part of the data representing data received and decoded).

The memory ROM 1302 comprises in particular a "prog" program. The algorithms implementing the steps of the method specific to the present disclosure and described below are stored in the ROM 1302 memory associated with the telecommunication device 130 implementing these steps. When powered up, the microprocessor 1301 loads and runs the instructions of these algorithms.

The random access memory 1303 notably comprises:
in a register, the operating programme of the microprocessor 1301 responsible for switching on the telecommunication device 130,
reception parameters (for example parameters for modulation, encoding, MIMO, recurrence of frames),
transmission parameters (for example parameters for modulation, encoding, MIMO, recurrence of frames),
incoming data corresponding to the data received and decoded by the receiver 1306,
decoded data formed to be transmitted at the interface to the application 1305,
parameters of the lightfield camera,
lightfield data forming the lightfield image,
data representative of the first focal stack and of the second focal stack,
information representative of depth.

Other structures of the telecommunication device 130 than those described with respect to FIG. 13 are compatible with the present disclosure. In particular, according to variants, the telecommunication device may be implemented according to a purely hardware realisation, for example in the form of a dedicated component (for example in an ASIC (Application Specific Integrated Circuit) or FPGA (Field-Programmable Gate Array) or VLSI (Very Large Scale Integration) or of several electronic components embedded in an apparatus or even in a form of a mix of hardware elements and software elements.

The radio interface 1306 and the interface 1305 are for example adapted for the reception and transmission of signals according to one or several telecommunication standards such as IEEE 802.11 (Wi-Fi), standards compliant with the IMT-2000 specifications (also called 3G), with 3GPP LTE (also called 4G), IEEE 802.15.1 (also called Bluetooth) . . . .

According to a variant, the telecommunication device does not include any ROM but only RAM, the algorithms implementing the steps of the method specific to the present disclosure being stored in the RAM.

FIG. 14A shows a method of processing a lightfield image acquired with the lightfield camera of FIG. 1 or 2, according to a particular embodiment of the present principles. The method is for example implemented in the processing unit 103 or in the telecommunication device 130.

During an initialisation step 140, the different parameters of the lightfield camera, notably the parameters of the main lens and of the microlenses. The parameters are for example initialized when powering up the lightfield camera and/or when changing the parameter of the camera lens, for example the focal length, when zooming or focalizing. The lightfield data are advantageously initialized when powering up the lightfield camera and/or when acquiring a new lightfield image of a scene.

Then during a step 141, a first focal stack 1000A and a second focal stack 1000B are obtained, the first and second focal stacks each comprising a plurality of first and second images, respectively. The first focal stack is advantageously obtained from a first set of pixels forming the lightfield image (for example the pixels forming the first halves of the microlens images of the lightfield image as described with regard to FIGS. 7 and 11A, 11B or the pixels forming the first half of the views of the lightfield image as described with regard to FIGS. 9A and 9B). The second focal stack is advantageously obtained from a second set of pixels forming the lightfield image (for example the pixels forming the second halves of the microlens images of the lightfield image as described with regard to FIGS. 7 and 11A, 11B or the pixels forming the second half of the views of the lightfield image as described with regard to FIGS. 9A and 9B). The second set of pixels is different from the first set of pixels, i.e. at least some of the pixels of the first set are not comprised in the second set and/or at least some of the pixels of the second set are not comprised in the first set.

The step 131 is advantageously reiterated for each acquired lightfield image.

FIG. 14B shows a method of obtaining depth information from the focal stacks 1000A and 1000B obtained at step 131, according to a particular embodiment of the present principles. The method is for example implemented in the processing unit 103 or in the telecommunication device 130.

During a step 142, the first focal stack 1000A is compared with the second focal stack 1000B in a way as to compare at least two first images of the first focal stack with at least two second images of the second focal stack, i.e. one first image of the first focal stack is compared with one corresponding second image of the second focal stack. A second image is said corresponding to the first image when the focalization distance (or the depth) associated with this second image is the same as the focalization distance (or the depth) associated with the first image. The first image and the corresponding second images are compared on a pixel basis or on a block of pixels basis. The pixels (or block of pixels) of the first image are compared with the pixels (or block of pixels) by comparing the grey level associated with the pixels and to find pixels of the second image corresponding to pixels of the first image. A pixel of the second image corresponds to a pixel of the first image when the grey level of the pixel of the second image is close to or equal to the grey level of the corresponding pixel of the first image.

According to a variant, the comparison comprises the determination, in each pair of first and second images having the same associated focalization distance (or equivalently the same associated depth value), disparity values associated with the pixels of the first image and/or pixels of the second image of said each pair.

Then during a step 143, information representative of depth, for example disparity information (for example expressed in pixels) or depth information (for example expressed in meters), is obtained from the results of the comparison of at least two pairs of first image/second image of the first and second focal stacks. A depth map or disparity map is for example obtained from the comparison of each pair of first image/second image, i.e. from the seven pairs of first images/second images according to the example of FIG. 10, i.e. the pairs 1001A/1001B, 1002A/1002B to 1007A/1007B. A final depth information, for example a final depth map or a final disparity map, is obtained from the maps obtained from each pair, for example by combining the maps obtained from the different pairs of by selecting one of them.

According to a variant, only the pixels of the first and second images of each pair for which the disparity is close to 0 are determined from the comparison result, the depth associated with the pixel for which the disparity is equal to 0 for a given pair being the depth (or the focalization distance) associated with this pair. In each pair of first and second images having the same associated depth value, pixels of the first image and/or the second image of said each pair having as disparity value a value close to 0 are advantageously selected. The final depth information is obtained by gathering all depth information associated with pixels for which the disparity information is close to 0 from the comparison of each pair of first image/second image. Said differently, the computation of the depth information is performed between 2 refocused images of a pair of first image/second image from the first and second focal stacks. The 2 refocused images are chosen from index n=0 to index n=N. The local disparity $\Delta_n(X,Y)$ at pixel (X,Y) of these first and second images of a pair is computed. $\Delta_n(X,Y)$ is given in unit of pixel. $\Delta_n(X,Y)$ is equal to 0 if the object is exactly distant from the lightfield camera by z(n), i.e. the depth associated with both first and second images of a pair. The distance of the object visible at coordinate (X,Y) is almost equal to z(n') with n' being the index of the refocused image (i.e. the first or the second image) for which $|\Delta_n(X,Y)|$ has a value close to or equal to 0.

Disparity values are considered close to 0 when they are for example less than a determined value, for example 0.25 or 0.5 pixel. The determined value is for example a fixed value or a value that depends from the method used to calculate the disparity, depending on the precision of the method. According to a variant, for a given pixel of the first or second image, a disparity value close to 0 is the disparity value, the absolute value of which being the minimum one when considering all absolute disparity values associated with this pixel in the different pairs of first/second images of the focal stacks.

Figure 12:
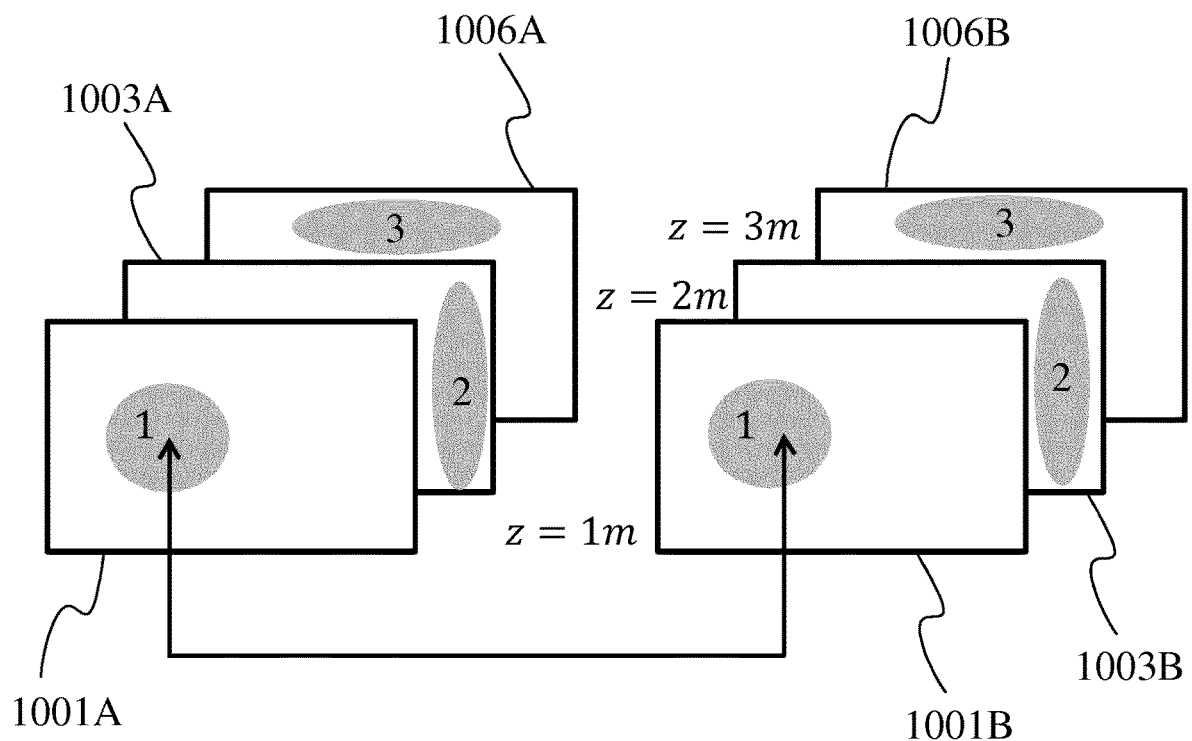
FIG. 12 shows a map comprising information representative of depth obtained from the first and second focal stacks of FIG. 10, according to a particular embodiment of the present principles.
Figure 12:
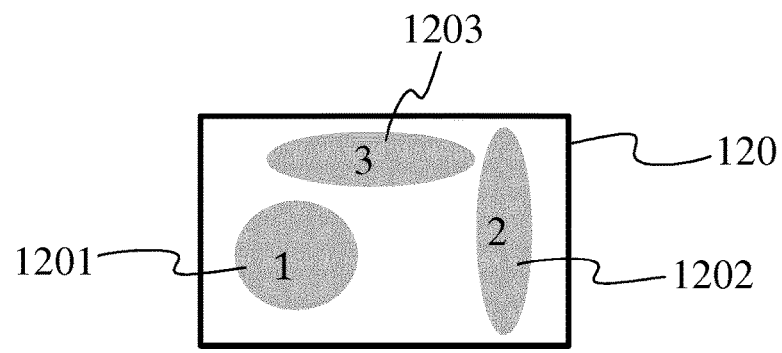

FIG. 12 shows a map 120 comprising information representative of depth (for example disparity values or depth values) obtained from the comparison results of the focal stacks 1000A and 1000B, according to a particular and non-limitative embodiment of the present principles. For clarity purpose, only three pairs of first images/second images are illustrated, i.e. the first pair comprising the first image 1001A and the second image 1001B at depth z=1m, the second pair comprising the first image 1003A and the second image 1003B at depth z=2m and the third pair comprising the first image 1006A and the second image 1006B at depth z=3m. In each pair, the pixels of the first image corresponding to the second pixels of the second image are shown with grey background, these pixels being identified with the reference 1 in the first pair, with the reference 2 in the second pair and with the reference 3 in the third pair. As the depth associated with the first pair is equal to 1 meter, the depth associated with the pixels referenced 1 in the first pair is also 1 meter. For the same reason, the depth associated with the pixels referenced 2 in the images of the second pair is equal to 2 meters and the depth associated with the pixels referenced 3 in the images of the third pair is equal to 3 meters. A final depth map 120 (or equivalently a disparity map) is advantageously obtained by gathering the depth values associated with area(s) of corresponding pixels of each pair of images, i.e. the depth value associated with the pixels of the area 1201 is equal to 1 meter, the depth value associated with the pixels of the area 1202 is equal to 2 meters and the depth value associated with the pixels of the area 1203 is equal to 3 meters. When some pixels of the final depth map 120 do not receive depth information from the comparison results of the pairs of images of the two focal stacks, the depth information associated with these pixels may be for example obtained by interpolating pixels surrounding them having depth values obtained from the comparison results of the focal stacks.

According to an optional variant, the final depth map 120 is processed to display the scene with 3D effects, the depth/disparity information of the final depth map being used to determine the depth of displaying of the objects of the scene. According to another variant, the final depth map 120 is processed to crop the objects of the image(s) of the scene according to their associated depth/disparity. According to another variant, the final depth map is processed to generate a 3D view of the scene.

The steps 131 to 133 are advantageously reiterated for each acquired lightfield image.

FIG. 14C shows a method of displaying the focal stacks 1000A and 1000B obtained at step 131, according to a particular embodiment of the present principles.

During a step 144, first and second images are transmitted for displaying on a display device. The display device is for example a display screen (for example a LCD ("Liquid Crystal Display") or an OLED ("Organic Light-Emitting Diode") display device) displaying sequentially the first image of a pair and the second image of a same pair, the display device being advantageously associated with a pair of active or passive glasses to synchronize the display of the first and second images with the right and left eyes of a viewer, respectively, which enables the first image to be viewed only by the left eye for example and the second image to be viewed only by the right eye. According to a variant, the display device is a HMD ("Head-Mounted Display") adapted to display left and right images of a stereoscopic pair of images, the first image being for example displayed as a left image and the second image as a right image. The pairs of images of the first and second stacks are for example transmitted sequentially and displayed when received by the display device. According to a variant, the transmitted pairs of images are stored in a memory of the display device before being displayed. Displaying the first and second images of a pair as a stereoscopic pair of images enable to display objects of the first and second image in focus, the focus corresponding to the depth associated with the pair of images.

The step 144 is for example performed after the step 141 without performing the steps 142 and 143. According to a variant, the step 141 is performed in addition to the steps 142 and 143, for example after the steps 142 and 143, in parallel to the steps 142 and 143 or after the steps 142 and 143.

Naturally, the present disclosure is not limited to the embodiments previously described.

In particular, the present disclosure is not limited to an apparatus configured to process lightfield image(s) or to a method of processing lightfield image(s) but also extends to method/apparatus for determining depth information and/or to a method/apparatus for displaying images of focal stacks and/or to a lightfield camera comprising such an apparatus or to any device comprising such an apparatus or implementing such method(s), for example a telecommunication device.

Telecommunication devices includes, for example, smartphones, smartwatches, tablets, computers, mobile phones, portable/personal digital assistants ("PDAs"), and other devices that facilitate communication of information between end-users but also set-top-boxes.

The method of calibrating the plenoptic camera described herein may be implemented by instructions being performed by a processor, and such instructions (and/or data values produced by an implementation) may be stored on a processor-readable medium such as, for example, an integrated circuit, a software carrier or other storage device such as, for example, a hard disk, a compact diskette ("CD"), an optical disc (such as, for example, a DVD, often referred to as a digital versatile disc or a digital video disc), a random access memory ("RAM"), or a read-only memory ("ROM"). The instructions may form an application program tangibly embodied on a processor-readable medium. Instructions may be, for example, in hardware, firmware, software, or a combination. Instructions may be found in, for example, an operating system, a separate application, or a combination of the two. A processor may be characterized, therefore, as, for example, both a device configured to carry out a process and a device that includes a processor-readable medium (such as a storage device) having instructions for carrying out a process. Further, a processor-readable medium may store, in addition to or in lieu of instructions, data values produced by an implementation.

As will be evident to one of skill in the art, implementations may produce a variety of signals formatted to carry information that may be, for example, stored or transmitted. The information may include, for example, instructions for performing a method, or data produced by one of the described implementations. For example, a signal may be formatted to carry as data the rules for writing or reading the syntax of a described embodiment, or to carry as data the actual syntax-values written by a described embodiment. Such a signal may be formatted, for example, as an electromagnetic wave (for example, using a radio frequency portion of spectrum) or as a baseband signal. The formatting may include, for example, encoding a data stream and modulating a carrier with the encoded data stream. The information that the signal carries may be, for example, analog or digital information. The signal may be transmitted over a variety of different wired or wireless links, as is known. The signal may be stored on a processor-readable medium.

A number of implementations have been described. Nevertheless, it will be understood that various modifications may be made. For example, elements of different implementations may be combined, supplemented, modified, or removed to produce other implementations. Additionally, one of ordinary skill will understand that other structures and processes may be substituted for those disclosed and the resulting implementations will perform at least substantially the same function(s), in at least substantially the same way(s), to achieve at least substantially the same result(s) as the implementations disclosed. Accordingly, these and other implementations are contemplated by this application.

The invention claimed is:

1. An apparatus configured to process a lightfield image of a scene, said lightfield image being composed of a set of microlens images, the apparatus comprising a memory to store data representative of the lightfield image and a processor configured to:

obtain a pair of focal stacks having a first focal stack and a second focal stack, the first focal stack being obtained from first halves of microlens images of the set of microlens images and the second focal stack being obtained from second halves of said microlens images of the set of microlens images, the first half and the second half of a microlens image being different or the first focal stack being obtained from a first subset of the microlens images of the set of microlens images and the second focal stack being obtained from a second subset of the microlens images of the set of microlens images, the first subset and the second subset comprising different microlens images of the set of microlens images;

wherein the first focal stack comprising a plurality of first images each representative of the scene, a different depth value of a plurality of depth values being associated with each first image, said first images being generated from a first set of pixels of said lightfield image, the second focal stack comprising a plurality of second images each representative of the scene, a different depth value of said plurality of depth values being associated with each second image, said second images being generated from a second set of pixels of said lightfield image, the second set being different from the first set; and associate, for each pair of a plurality of pairs of first and second images having a same associated depth value, a depth information with pixels of said each pair having as disparity value a value close to 0, said depth information corresponding to said depth value of said each pair.

2. The apparatus according to claim 1, wherein the processor is further configured to:

compare the first image with the second image of said each pair; and obtain information representative of depth from results of the comparing.

3. The apparatus according to claim 2, wherein the processor is further configured to determine, in said each pair, disparity values associated with the pixels of the first image and/or pixels of the second image of said each pair.

4. The apparatus according to claim 1, wherein said first half and said second half of a microlens image or said first subset of microlens images and said second subset of microlens images being determined according to an information representative of orientation of at least one object of said scene within said scene.

5. The apparatus of claim 1 wherein the apparatus is a light-field acquisition device.

6. The apparatus according to claim 1, wherein said first focal stack is generated from a first half of a multi-camera array, said second focal stack is generated from a second half of the multi-camera array, wherein the first half of the multi-camera array and the second half of the multi-camera array being respectively left half and right half of the multi-camera array.

7. The apparatus according to claim 1, wherein said first focal stack is generated from a first half of a multi-camera array, said second focal stack is generated from a second half of the multi-camera array, wherein the first half of the multi-camera array and the second half of the multi-camera array being respectively top half and bottom half of the multi-camera array.

8. The apparatus according to claim 1, wherein the processor is further configured to provide to a display, the paired plurality of first image and second images of the pair of stereoscopic focal stacks having the same associated depth value as a stereoscopic pair of images in focus, the focus corresponding to the same associated depth value.

9. A method of processing a lightfield image of a scene, the method comprising:

obtaining a pair of focal stacks having a first focal stack and a second focal stack, the first focal stack being obtained from first halves of each microlens images and the second focal stack being obtained from second halves of each microlens images, the first halves and the second halves being different and complementary; or the first focal stack being obtained from a first half of the microlens images and the second focal stack being obtained from a second half of the microlens images, the first half and the second half being different and complementary;

wherein the first focal stack comprising a plurality of first images each representative of the scene, a different depth value of a plurality of depth values being associated with each first image, said first images being generated from a first set of pixels of said lightfield image, the second focal stack comprising a plurality of second images each representative of the scene, a different depth value of said plurality of depth values being associated with each second image, said second images being generated from a second set of pixels of said lightfield image, the second set being different from the first set; and associating, for each pair of a plurality of pairs of first and second images having a same associated depth value, a depth information with pixels of said each pair having as disparity value a value close to 0, said depth information corresponding to said depth value of said each pair.

10. The method according to claim 9, further comprising:
comparing the first images with the second images in a way as to compare each first image with each second image having the same associated depth value as said each first image; and
obtaining information representative of depth from results of the comparing.

11. The method according to claim 10, wherein the comparing comprises determining, in each pair of first and second images having the same associated depth value, disparity values associated with the pixels of the first image and/or pixels of the second image of said each pair.

12. The method according to claim 11, wherein the comparing further comprises selecting, in each pair of first and second images having the same associated depth value, pixels of the first image and/or the second image of said each pair having as disparity value a value close to 0.

13. The method according to claim 9, wherein said first half and said second half of a microlens image or said first subset and said second subset being determined according to an information representative of orientation of at least one object of said scene within said scene.

14. The method according to claim 9, wherein said first focal stack is generated from a first half of a multi-camera array, said second focal stack is generated from a second half of the multi-camera array, the first half of the multi-camera array and the second half of the multi-camera array being respectively left half and right half of the multi-camera array.

15. The method according to claim 9, wherein said first focal stack is generated from a first half of a multi-camera array, said second focal stack is generated from a second half of the multi-camera array, wherein the first half of the multi-camera array and the second half of the multi-camera array being respectively top half and bottom half of the multi-camera array.

16. The method according to claim 9, further comprising providing to a display, the paired plurality of first image and second images of the pair of stereoscopic focal stacks having the same associated depth value as a stereoscopic pair of images in focus, the focus corresponding to the same associated depth value.

* * * * *